(12) United States Patent
Booth et al.

(10) Patent No.: US 7,037,820 B2
(45) Date of Patent: May 2, 2006

(54) CROSS-FILL PATTERN FOR METAL FILL LEVELS, POWER SUPPLY FILTERING, AND ANALOG CIRCUIT SHIELDING

(75) Inventors: Richard Booth, Riegelsville, PA (US); Donald Dazzo, Jr., Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/767,205

(22) Filed: Jan. 30, 2004

(65) Prior Publication Data

US 2005/0167702 A1 Aug. 4, 2005

(51) Int. Cl.
*H01L 21/44* (2006.01)
*H01L 21/4763* (2006.01)
*H01L 29/40* (2006.01)

(52) U.S. Cl. .................. 438/618; 438/666; 438/669; 257/773

(58) Field of Classification Search ........... 438/618, 438/666, 669; 257/773
See application file for complete search history.

(56) References Cited

U.S. PATENT DOCUMENTS 6,781,238 B1 * 8/2004 Nonaka .................. 257/773

OTHER PUBLICATIONS

Wolf, Stanley; "Silicon Processing for the VLSI Era," v.2, 1990, p. 555-556.*

* cited by examiner

*Primary Examiner*—David S. Blum

(57) ABSTRACT

A cross-fill metal fill pattern technique is provided such that portions of a metal fill pattern are patterned to accomplish a secondary function. For instance, in the exemplary embodiments, ever other trace or line of interdigitated fingers is routed to a ground, while the interceding traces or lines of interdigitated fingers are routed to a power supply. In this way, a capacitor function is formed across the power supply, providing additional decoupling for the power supply. Moreover, a suitably tight cross-fill metal fill pattern (i.e., higher density of metal) provides an electrical shielding function for electromagnetic radiation passing therethrough.

6 Claims, 7 Drawing Sheets

CROSS-FILL PATTERN FOR METAL FILL LEVELS, POWER SUPPLY FILTERING, AND ANALOG CIRCUIT SHIELDING

BACKGROUND OF THE INVENTION

1. Field of the Invention

This invention relates to architecture of integrated circuits. More particularly, it relates to the layout design for filling open areas on each metal layer of an integrated circuit (IC).

2. Background of Related Art

One process in the manufacture of integrated circuits is referred to as an oxide chemical-mechanical polishing (CMP) process. CMP is very effective at reducing the as-deposited height, and achieves a measure of global planarization not possible with either spin-on or resist etchback techniques. However, CMP processes are hampered by layout pattern sensitivities which cause certain regions on a chip to have thicker dielectric layers than other regions due to differences in underlying topology.

Layout pattern dependent variation in the interlevel dielectric (ILD) thickness can reduce yield and impact circuit performance. Metal fill patterning practices have emerged as a technique for substantially reducing layout pattern dependent ILD thickness variation. Various process choices have been attempted by those in the art, with little appreciable variation in pattern-dependent dielectric thickness. Thus, the only viable choice available for reducing layout pattern dependent dielectric thickness variation is to change the layout pattern itself via the introduction of metal fill patterning.

Metal fill patterning is a process for filling large open areas on each metal layer with a metal fill pattern to provide a suitable metal density appropriate for relevant foundry technologies. Conventionally, the elements of the metal fill pattern are either grounded, or left floating, to compensate for pattern-driven variations. One conventional design utilizes a metal fill design rule that requires that all blank areas greater than 1 mm×1 mm in size have a metal fill pattern with an optimal density of 50%.

Conventional metal fill structures are either electrically grounded, or left electrically floating, or isolated. Grounded metal fill patterns tend to affect delay attributes in a layout, while floating or isolated metal fill patterns tend to increase coupling/crosstalk attributes.

Conventionally, metal-fill patterns are often produced en masse after chip level routing is complete. However, the inventors of the present application have appreciated that this is a problem, particularly for analog circuits which may be sensitive to the placement of these structures (for matching and other reasons). For example, conventional techniques place the structure of metal fill patterns deterministically, before the cell is placed, to avoid final, random placement.

One example of a conventional metal fill pattern is shown in FIG. 5, which shows a vertical line metal fill pattern 200 as disclosed by Stine et al. in "The Physical and Electrical Effects of Metal-Fill Patterning Practices for Oxide Chemical-Mechanical Polishing Processes", IEEE Transactions on Electron Devices, Vol. 45, No. 3, March 1998. In the example of FIG. 5, the vertical lines 202 of the metal fill pattern 200 are all commonly grounded.

Stine et al. also disclose a floating block metal fill pattern 300, as depicted in FIG. 6 herein.

Yet another example of a conventional deterministic approach is the use of so-called waffle-grid metal fill pattern 400, as shown in FIG. 7.

As shown in FIG. 7, a metal mesh or waffle-grid shaped metal fill pattern 400 is either electrically floated or grounded in an attempt to improve delay and/or crosstalk parameters.

While conventional techniques improve upon prior techniques, there is room for additional improvement. For instance, in conventional techniques the metal fill pattern functions solely as metal fill, with little or no significant other function. There is a need for a better metal fill pattern technique to better improve delay and/or crosstalk parameters, as well as producing better utilization of available space with metal fill patterns.

SUMMARY OF THE INVENTION

In accordance with the principles of the present invention, in an integrated circuit, a metal fill pattern comprises a first plurality of metal traces electrically connected to a power supply pad. A second plurality of metal traces are electrically connected to a ground pad. The second plurality of metal traces are interdigitated between the first plurality of metal traces to form a purposeful inter-metal capacitance therebetween.

A method In accordance with another aspect of the present invention forms a cross-fill metal fill pattern in an integrated circuit that provides a plurality of purposeful functions. A first plurality of parallel traces electrically connected are formed. A second plurality of parallel traces electrically connected are formed. The first plurality of parallel traces are electrically routed to a common power rail in the integrated circuit. The second plurality of parallel traces are electrically routed to a common ground rail in the integrated circuit. Short interdigitated fingers are physically connected to the parallel traces. The cross-fill metal pattern provides metal fill as a first purposeful function, and as a second purposeful function provides at least one of: capacitance across a power supply, or electromagnetic shielding to protect an analog circuit therebelow.

BRIEF DESCRIPTION OF THE DRAWINGS

Features and advantages of the present invention will become apparent to those skilled in the art from the following description with reference to the drawings, in which.

DETAILED DESCRIPTION OF THE ILLUSTRATIVE EMBODIMENTS

Figure 7:
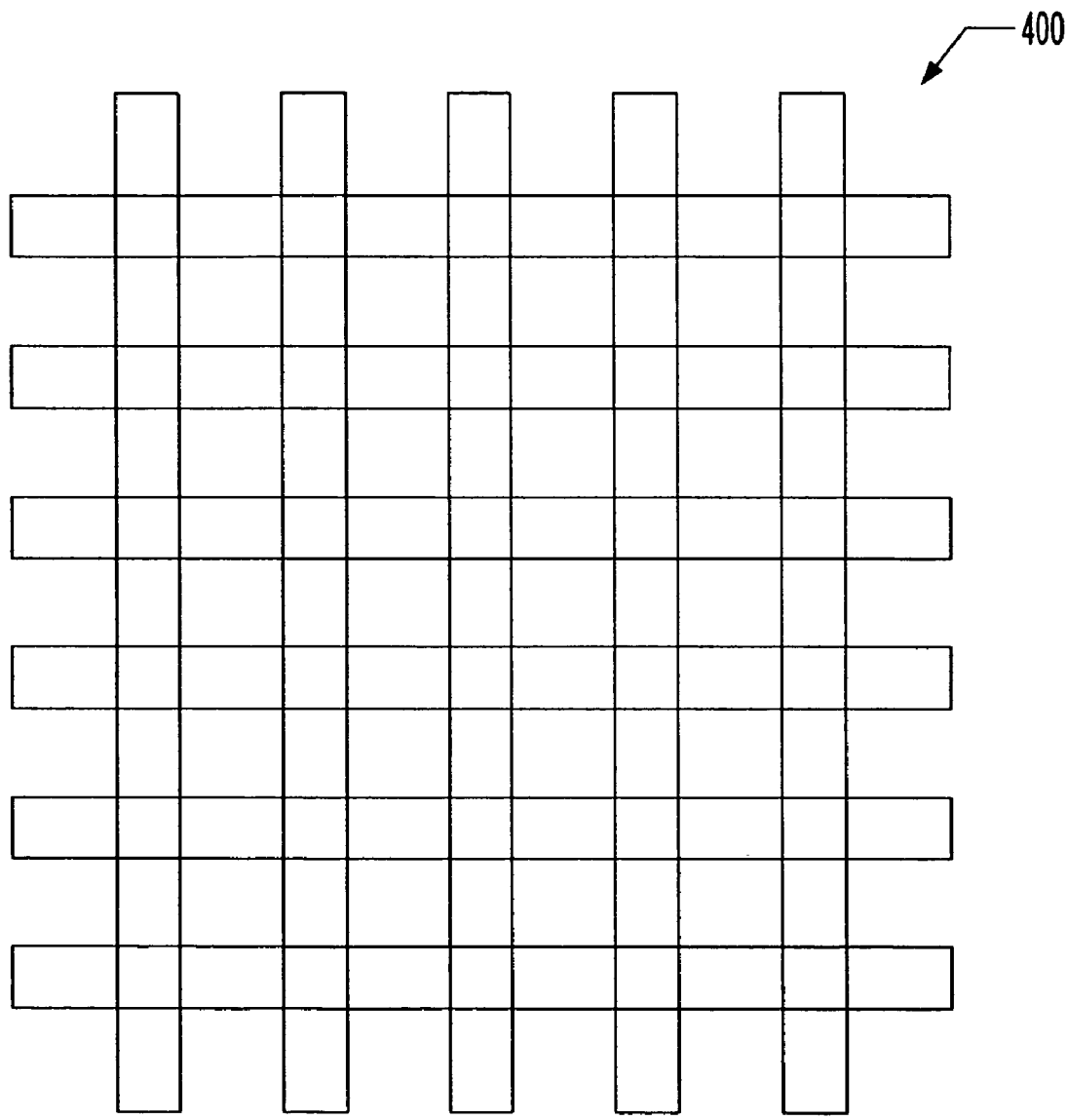
FIG. 7 shows a conventional metal mesh or waffle-grid shaped metal fill pattern.

The present inventors have appreciated that conventional metal fill patterns and techniques such as the conventional so-called waffle-grid approach shown in FIG. 7 purposely provide a singular function—i.e., metal density. Metal density as used herein refers to the portion of an area of an integrated circuit that is covered by metal, relative to the total area of the entire IC.

The metal density is desired to fall within a predetermined range to provide relative planarization to a subsequent layer.

The singular function of provision of metal density as taught by conventional techniques, e.g., using a waffle-grid metal fill pattern, does not provide an adequate shielding function, and is not purposely intended to provide such, nor any other circuit function.

In accordance with the principles of the present invention, a metal fill pattern technique is provided such that portions of a metal fill pattern are patterned not only to provide a desired metal density, but also to accomplish a secondary function. For instance, in the exemplary embodiments, every other column of interdigitated fingers is routed to a ground potential power rail, while the interceding columns of interdigitated fingers are routed to a power supply power rail. The terms 'column' and 'row', as well as 'vertical' and 'horizontal' as used herein are terms relative to one another, and/or relative to the orientation shown in a particular figure. It is to be understood by those of ordinary skill in the art that such orientations are relative and may easily be reversed, rotated, etc.

By routing every other line of interdigitated fingers to ground, and the interceding lines of interdigitated fingers to a power supply, a capacitor function is purposefully formed across the power supply, providing additional decoupling for the power supply. Moreover, a suitably tight cross-fill metal pattern (i.e., higher density of metal) provides an electrical shielding function for electromagnetic radiation passing therethrough.

Thus, the present invention provides a cross-fill metal fill pattern which accomplishes multiple important tasks. For instance, the cross-fill metal fill pattern approach achieves a desired metal density. However, it also functions as an excellent electrical shield from over-routed metal signal lines. Moreover, the cross-fill metal fill pattern approach as described herein forms a secondary function of a capacitance between lines of interdigitated fingers, which may be used to provide additional decoupling of a suitable power supply by connecting odd ones of alternating fingers to a power supply (e.g., 5V, 3.3V, 2.5V), and even ones of the alternating fingers to ground. In the disclosed embodiments, another secondary feature is provided (i.e., a tertiary feature) in that the metal fill pattern provides a shield layer to traces carrying the ground or the power supply.

The terms "power supply" and "power supply lines" and similar are used herein to refer both to a power source VDD voltage level input to the IC, but also to a regulated voltage level. For example, an on-board regulator may be implemented to generate an internal regulated voltage VREG, somewhat below the value of VDD. This regulated voltage might be used to power, e.g., sensitive analog components which require a power source VREG that is even quieter than VDD. Thus, the lines of interdigitated fingers described herein may be tied alternately to VREG and VSS to provide the desired secondary circuit functions.

Conventionally, these three features (provision of metal density, electrical shielding, and power supply decoupling) are performed separately. The present invention achieves all three features simultaneously using a regular and easily laid-out cross-fill metal fill pattern.

Figure 1:
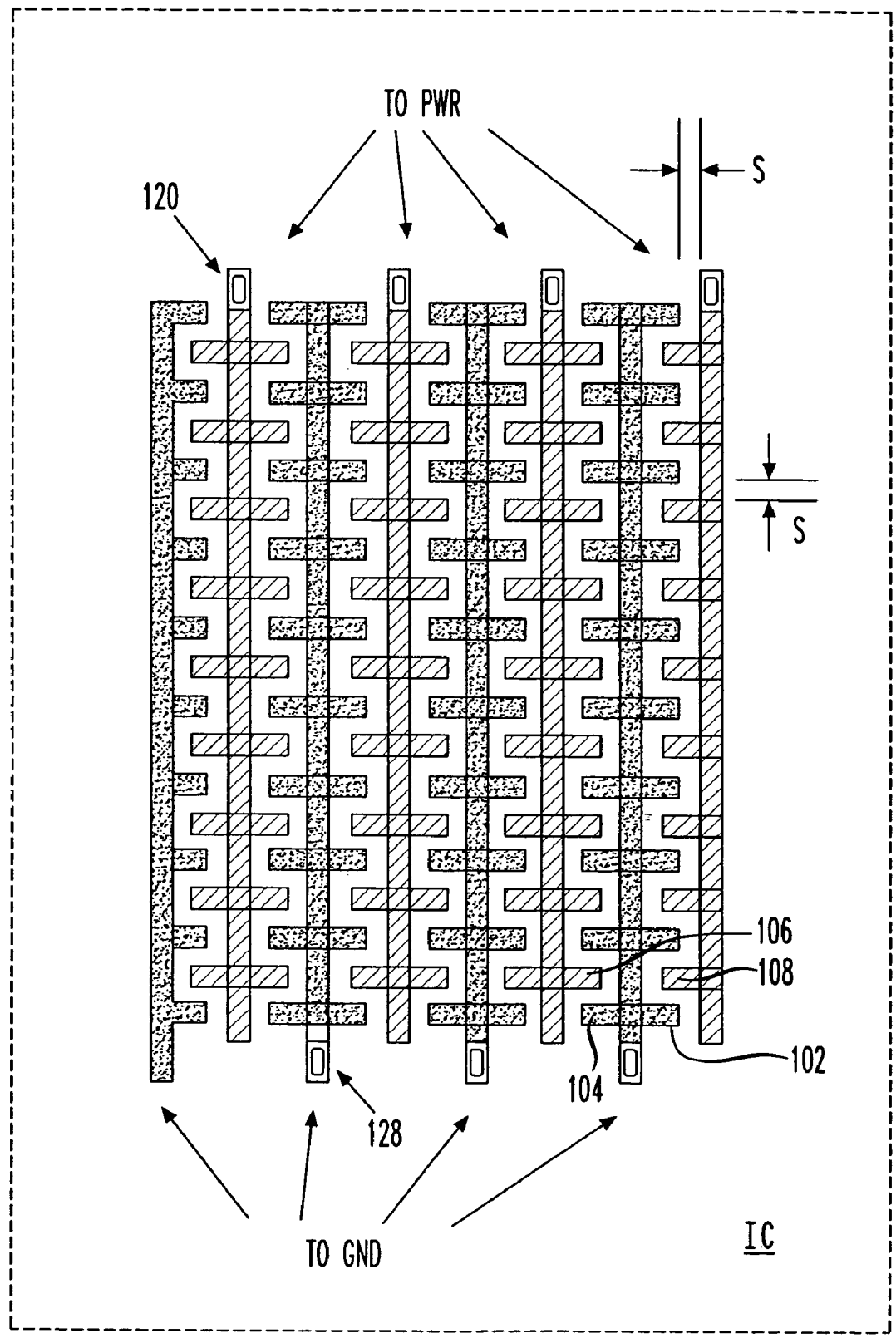
FIG. 1 shows an integrated circuit including a cross-fill metal fill pattern, in accordance with the principles of the present invention.

FIG. 1 shows an exemplary layout technique for forming a cross-fill metal fill pattern, in accordance with the principles of the present invention.

In particular, as shown in FIG. 1, substantially parallel metal traces or lines 120, 128 are alternately routed or otherwise electrically connected to the power supply bus, or to an electrical ground of the IC. Lines of interdigitated fingers 120 and 128 having extended finger portions 102, 104, 106, 108, etc. are formed to provide additional capacitive surface length adjacent to one another over a design wherein parallel lines are merely placed adjacent to one another. This produces a purposeful inter-metal capacitance between metal lines of interdigitated fingers 120 that are electrically routed to a power supply rail, and adjacent metal lines of interdigitated fingers 128 that are electrically routed to a common ground rail.

Thus, in accordance with the principles of the present invention, alternating lines of the cross-fill metal fill pattern are preferably tied to opposite sides of a power supply, providing additional decoupling capacitance to the power supply to that otherwise provided, either internally or externally.

The lines of interdigitated fingers form an inter-metal dielectric or Inter-line capacitance which can be used as a capacitor by a circuit in the IC, in the case of the disclosed embodiment as a decoupling capacitor between the power supply and ground to provide an additional amount of power-supply filtering. Analog capacitive filtering can hardly be placed closer to the components utilizing the power supply, so distinctive advantages are provided not only by the secondary use of metal fill as a capacitor, but also as a superior filtering function right at the point of use on the IC.

Moreover, in accordance with the principles of the present invention, the cross-fill metal fill pattern provides another secondary (i.e., a tertiary) function in that it forms an electrical shield tied to power and ground. The lines of interdigitated fingers 120, 128 forming the cross-fill metal fill pattern are routed over the cell of an IC module, and thus shield underlying devices (e.g., sensitive analog devices) composing the module. This is particularly useful to shield underlying sensitive analog circuitry from signal lines routed above the layer(s) containing the cross-fill metal fill pattern. For instance, in one embodiment, metal signal lines were routed over an insulative layer formed over a cross-fill metal fill pattern layer, with a distance between the routed metal signal lines and the underlying cross-fill metal fill pattern of about 7200 angstroms. The cross-fill metal fill pattern provided a suitable electromagnetic shielding function to shield underlying sensitive analog circuitry.

The metal thickness (horizontal and/or vertical) and/or spacing may be selected provide an accurate desired amount of metal density required for a particular integrated circuit (IC) patterning and fabrication.

Figure 2:
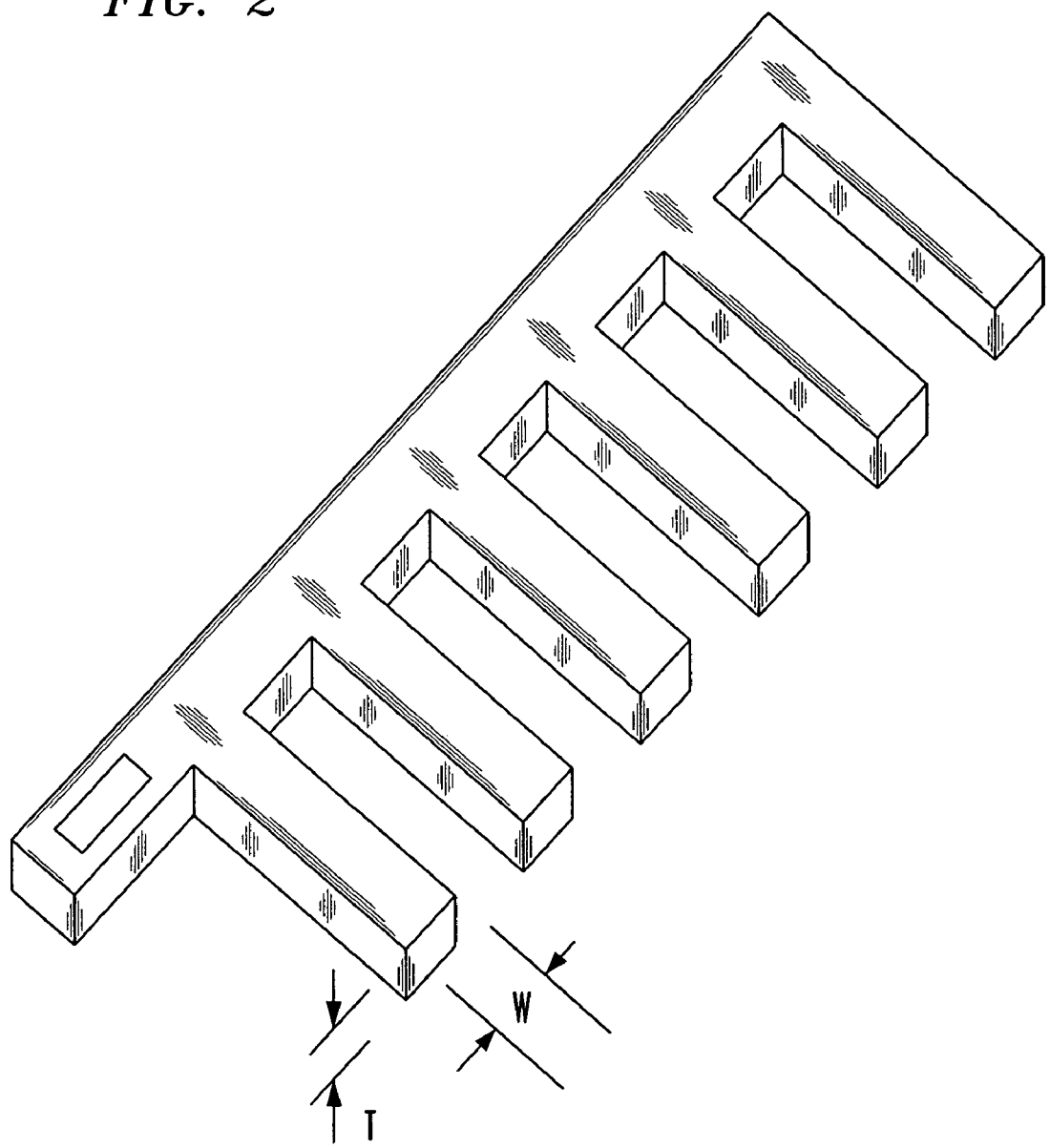
FIG. 2 depicts the width and thickness dimensions of an exemplary portion of a cross-fill metal fill pattern, in accordance with the principles of the present invention.

FIG. 2 depicts the width and thickness dimensions of an exemplary portion of a cross-fill metal fill pattern, in accordance with the principles of the present invention.

The metal width W is shown in FIG. 2, as is the metal thickness T, whereas the spacing S is shown in FIG. 1. The metal width W and spacing S have minimum values which are values recommended by the process in which the IC is fabricated. The metal thickness T is a technology parameter which cannot ordinarily be changed by a circuit designer. The metal thickness T is important, since it determines the area of the interdigitated capacitor plate: $A=T*L$, where L is the length of the relevant metal segment.

In the disclosed embodiments, the metal width of the cross fill metal fill pattern was approximately 5 microns, or more than twice the minimum design rule.

The columns and rows of the lines of interdigitated fingers 120, 128 comprising both the grounded portions and powered portions of the cross-fill metal fill pattern may be deposited in any suitable fashion, in any suitable order. For instance, the small row pieces forming fingers 102, 104, 106, 108 may be deposited first, followed by a deposition of the long vertical columns, or vice versa. Alternatively, all portions of the cross-fill metal fill pattern may be deposed substantially simultaneously.

An approximately 50% fill density was targeted as a minimum fill density in a given embodiment where lines and spacings are about equal. However, it is to be understood that while a 50% metal fill density might be a target based on the particular application, it is in no way a requirement, depending upon the foundry design rules.

Figure 3:
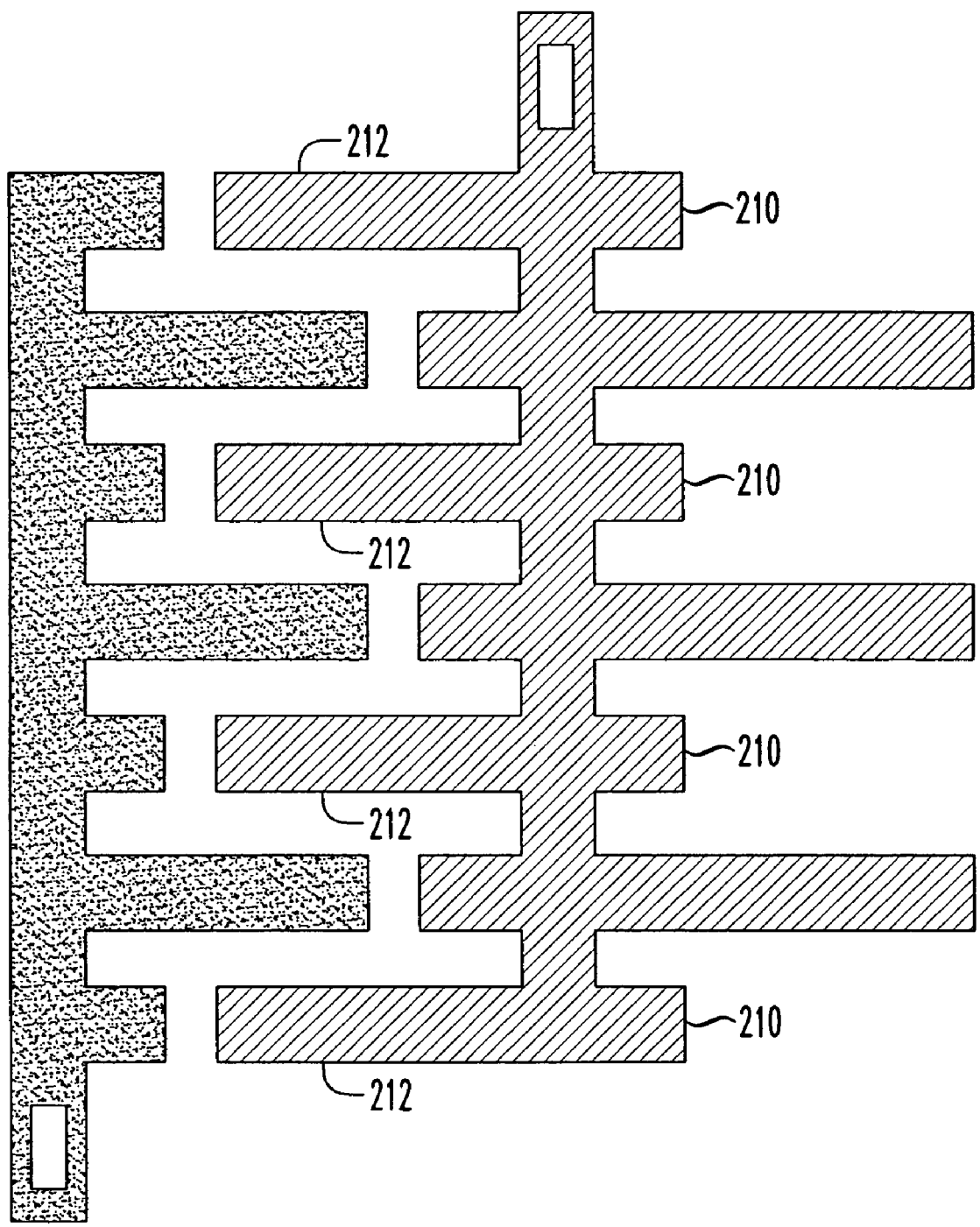
FIG. 3 shows another cross-fill metal fill pattern comprising alternative sizes of lines of interdigitated fingers, in accordance with another aspect of the present invention.

FIG. 3 shows another cross-fill metal fill pattern comprising alternative sizes of interdigitated fingers, in accordance with another aspect of the present invention.

In particular, as shown in FIG. 3, a cross-fill metal fill pattern comprising adjacent lines of interdigitated fingers is represented. As shown in FIG. 3, the interdigitated fingers 210, 212 may be of any suitable size and/or length.

Figure 4:
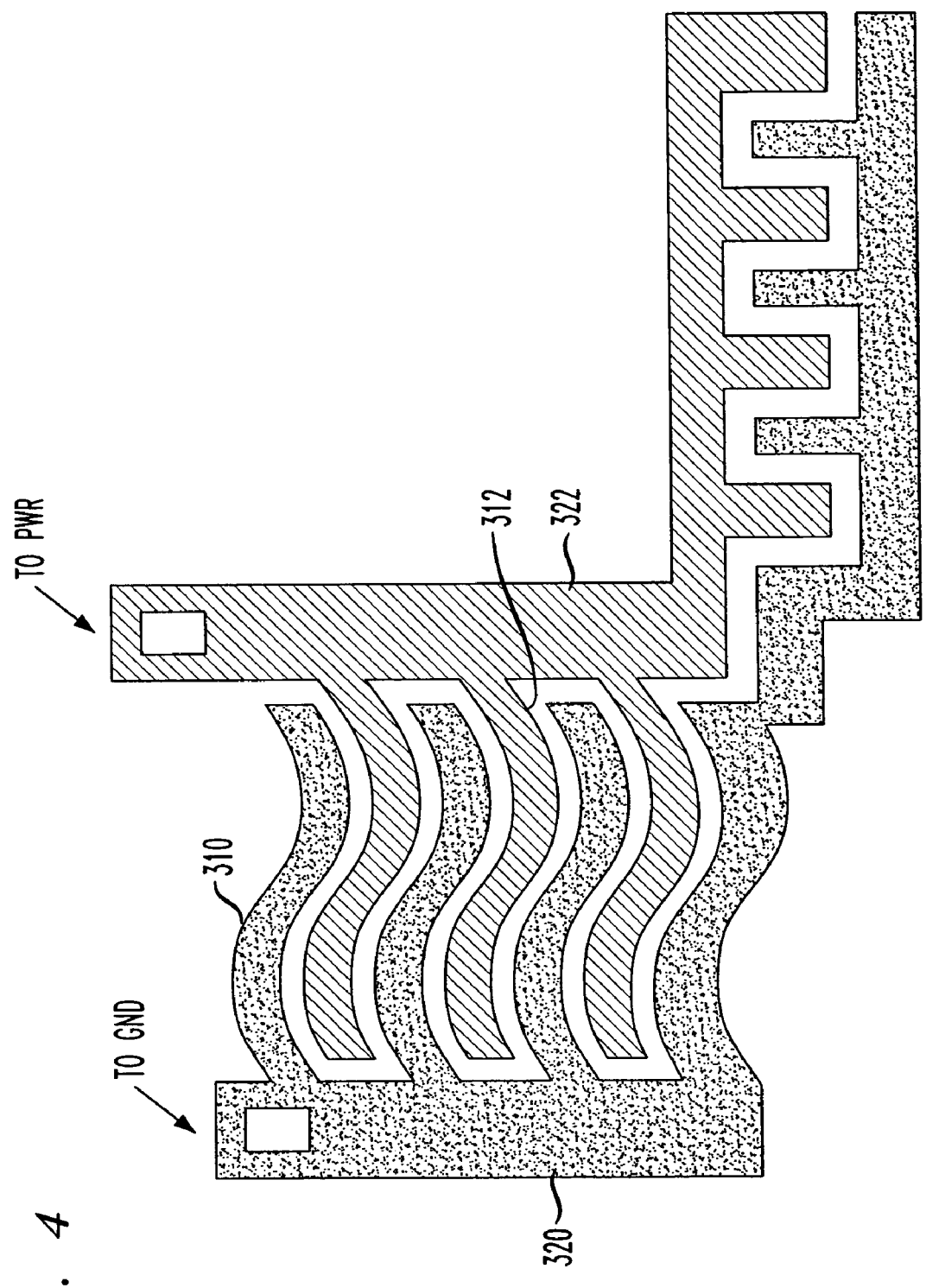
FIG. 4 shows yet another cross-fill metal fill pattern comprising curving linear interdigitated fingers as well as another pattern for lines of interdigitated fingers, in accordance with yet another aspect of the present invention.
Figure 5:
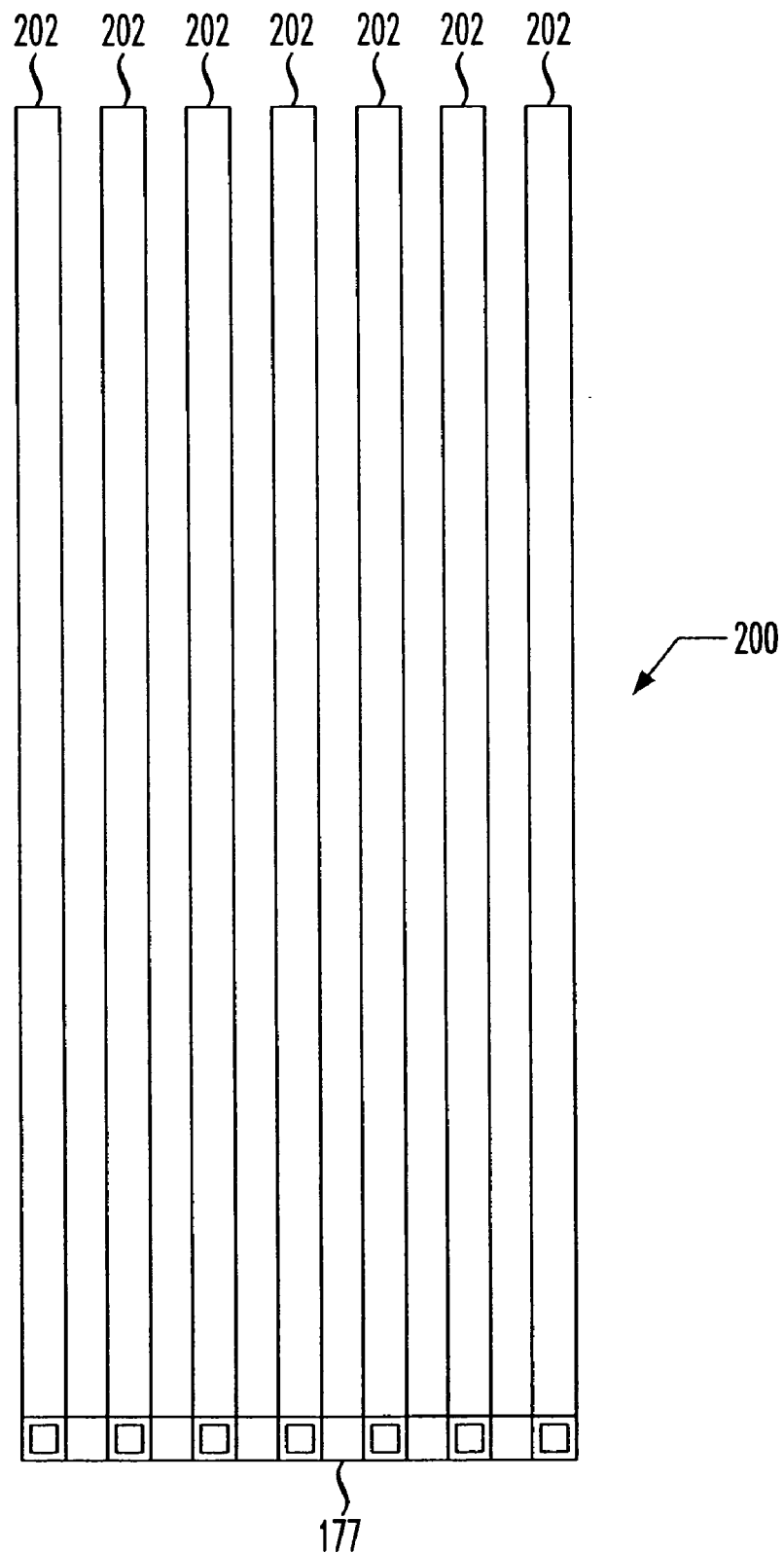
FIG. 5 shows one conventional metal fill pattern consisting of vertical straight linear lines or traces.
Figure 6:
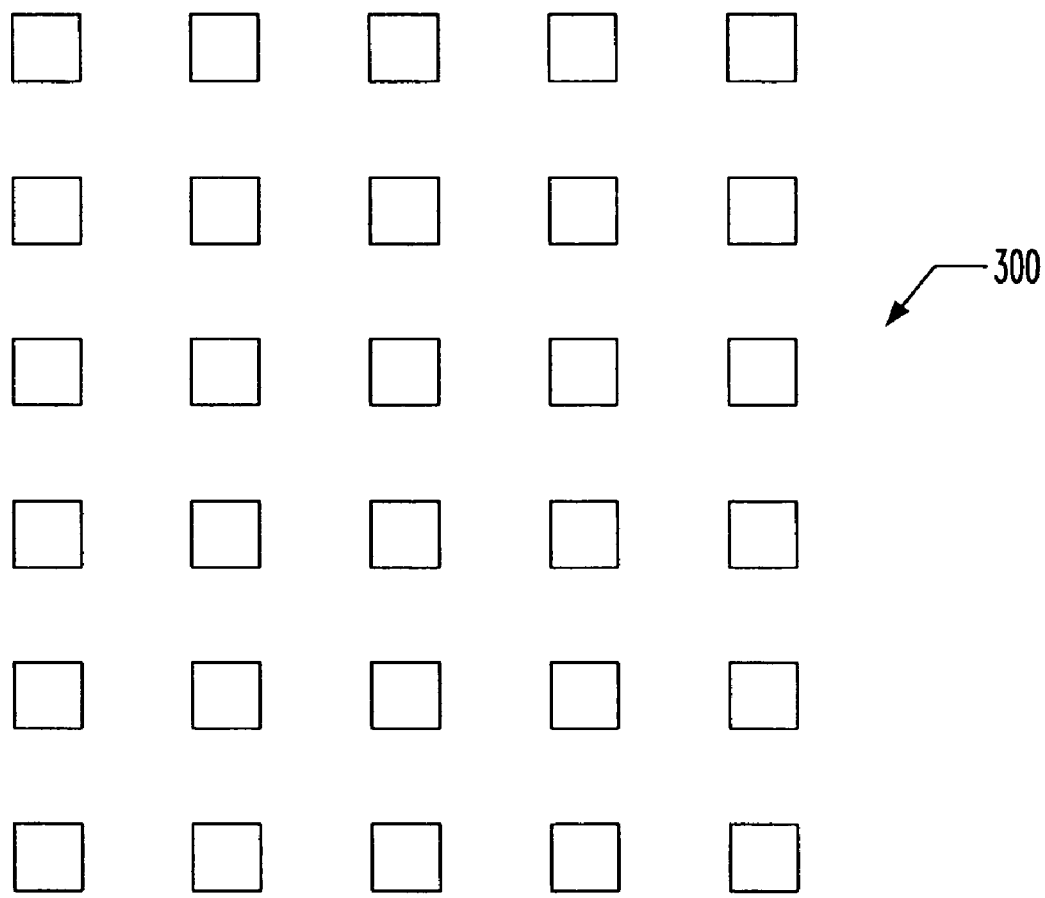
FIG. 6 shows another conventional metal fill pattern consisting of floating blocks.

FIG. 4 shows yet another cross-fill metal fill pattern comprising curving linear interdigitated fingers as well as another patterned shape of interdigitated fingers, in accordance with yet another aspect of the present invention.

In particular, as shown in FIG. 4, interdigitated fingers 310, 312 need not be straight. For instance, interdigitated fingers 310, 312 having curved shapes may be closely placed to form an inter-metal capacitor between adjacent feeding columns 320, 322.

The present invention is suitable for use in any technology used for the IC fabrication. Also, thickness of the cross-fill metal fill pattern is related and limited to the particular technology being used to manufacture the IC. With respect to line width, in the given embodiments, the width of the cross-fill metal fill pattern was approximately twice that of a minimum line width defined by the particular technology (which in the disclosed embodiments is a low voltage technology known as "TSMC13LV"), but the invention is not limited thereto.

Moreover, while the invention was disclosed in embodiments which exhibit symmetrical patterns and/or interdigitated fingers of approximately equal length, such symmetry and equal length of interdigitated fingers, e.g., interdigitated fingers 102–108 shown in FIG. 1 are not a requirement.

While the invention has been described with reference to the exemplary embodiments thereof, those skilled in the art will be able to make various modifications to the described embodiments of the invention without departing from the true spirit and scope of the invention.

What is claimed is:

1. A method of forming a cross-fill metal fill pattern in an integrated circuit that provides a plurality of purposeful functions, comprising:
    forming a first plurality of parallel traces electrically connected;
    forming a second plurality of parallel traces electrically connected;
    electrically routing said first plurality of parallel traces to a common power rail in said integrated circuit;
    electrically routing said second plurality of parallel traces to a common ground rail in said integrated circuit; and
    over-routing signal bearing metal lines over said first plurality of parallel traces and said second plurality of parallel traces;
    wherein said cross-fill metal pattern provides metal fill as a first purposeful function, and as a second purposeful function provides at least one of capacitance across a power supply, and electro-magnetic shielding to protect an analog circuit therebelow from said over-routed signal bearing metal lines.

2. The method of forming a metal fill pattern in an integrated circuit that provides a plurality of purposeful functions according to claim 1, further comprising:
    forming interdigitated fingers physically connected to at least one of said first plurality of parallel traces; and
    forming interdigitated fingers physically connected to at least one of said second plurality of parallel traces.

3. The method of forming a metal fill pattern in an integrated circuit that provides a plurality of purposeful functions according to claim 1, wherein:
    said cross-fill metal pattern achieves three purposeful functions of (1) providing metal fill, (2) provides decoupling capacitance across a power supply when powering said integrated circuit, and (3) provides an electro-magnetic shield to protect an analog circuit therebelow from said over-routed signal bearing metal lines.

4. Apparatus for forming a cross-fill metal fill pattern in an integrated circuit that provides a plurality of purposeful functions, comprising:
    means for forming a first plurality of parallel traces electrically connected;
    means for forming a second plurality of parallel traces electrically connected;
    means for electrically routing said first plurality of parallel traces to a common power rail in said integrated circuit;
    means for electrically routing said second plurality of parallel traces to a common ground rail in said integrated circuit; and
    means for over-routing signal bearing metal lines over said first plurality of parallel traces and said second plurality of parallel traces;
    wherein said cross-fill metal pattern provides metal fill as a first purposeful function, and as a second purposeful function provides at least one of capacitance across a power supply, and electro-magnetic shielding to protect an analog circuit therebelow from said over-routed signal bearing metal lines.

5. The apparatus for forming a metal fill pattern in an integrated circuit that provides a plurality of purposeful functions according to claim 4, further comprising:
    means for forming interdigitated fingers physically connected to at least one of said first plurality of parallel traces; and
    means for forming interdigitated fingers physically connected to at least one of said second plurality of parallel traces.

6. The method of forming a metal fill pattern in an integrated circuit that provides a plurality of purposeful functions according to claim 4, wherein:
    said cross-fill metal pattern achieves three purposeful functions of (1) providing metal fill, (2) provides decoupling capacitance across a power supply when powering said integrated circuit, and (3) provides an electro-magnetic shield to protect an analog circuit therebelow from said over-routed signal bearing metal lines.

* * * * *